US010976666B1

(12) United States Patent
Hall et al.

(10) Patent No.: US 10,976,666 B1
(45) Date of Patent: Apr. 13, 2021

(54) APPARATUS AND RELATED METHOD TO CONTROL RADIATION TRANSMISSION THROUGH MASK PATTERN

(71) Applicant: GLOBALFOUNDRIES U.S. Inc., Santa Clara, CA (US)

(72) Inventors: Ezra D. B. Hall, Richmond, VT (US); Jed H. Rankin, Richmond, VT (US); Alok Vaid, Halfmoon, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/661,220

(22) Filed: Oct. 23, 2019

(51) Int. Cl.
*G03F 7/20* (2006.01)

(52) U.S. Cl.
CPC ...... *G03F 7/70116* (2013.01); *G03F 7/70191* (2013.01); *G03F 7/70208* (2013.01)

(58) Field of Classification Search
CPC ............. G03F 7/70116; G03F 7/70191; G03F 7/70208; G03F 7/70266; G03F 7/70283; G03F 7/70291; G03F 7/70308; G03F 7/70458
USPC ......................................... 355/67, 71; 430/5
See application file for complete search history.

(56) References Cited

U.S. PATENT DOCUMENTS

| 6,480,324 | B2 | 11/2002 | Quate et al. | |
|---|---|---|---|---|
| 7,154,654 | B2 | 12/2006 | Kimura | |
| 2005/0140955 | A1* | 6/2005 | Butler | G03B 27/72 355/69 |
| 2005/0153215 | A1* | 7/2005 | Bornstein | G03F 7/70291 430/5 |
| 2013/0003036 | A1* | 1/2013 | Akiyama | G03F 1/62 355/72 |
| 2015/0362841 | A1* | 12/2015 | Zelsacher | G03F 7/70058 355/67 |

OTHER PUBLICATIONS

G. P. Watson et al., "Spatial light modulator for maskless optical projection lithography," 2006, American Vacuum Society, 6 pages.
Hall et al., "Programmale Photolithographic Masks for Novel Trust and Assurance Approaches," Globalfoundris Inc., published Jan. 11, 2019, 5 pages.

* cited by examiner

*Primary Examiner* — Colin W Kreutzer
(74) *Attorney, Agent, or Firm* — Francois Pagette; Hoffman Warnick LLC

(57) ABSTRACT

Embodiments of the present disclosure provide an apparatus including mask pattern formed on a mask substrate. A plurality of spatial radiation modulators may be vertically displaced from the mask pattern, and distributed across a two-dimensional area. Each of the plurality of spatial radiation modulators may be adjustable between a first transparent state and a second transparent state to control whether radiation transmitted through the mask pattern passes through each of the plurality of spatial radiation modulators.

18 Claims, 8 Drawing Sheets

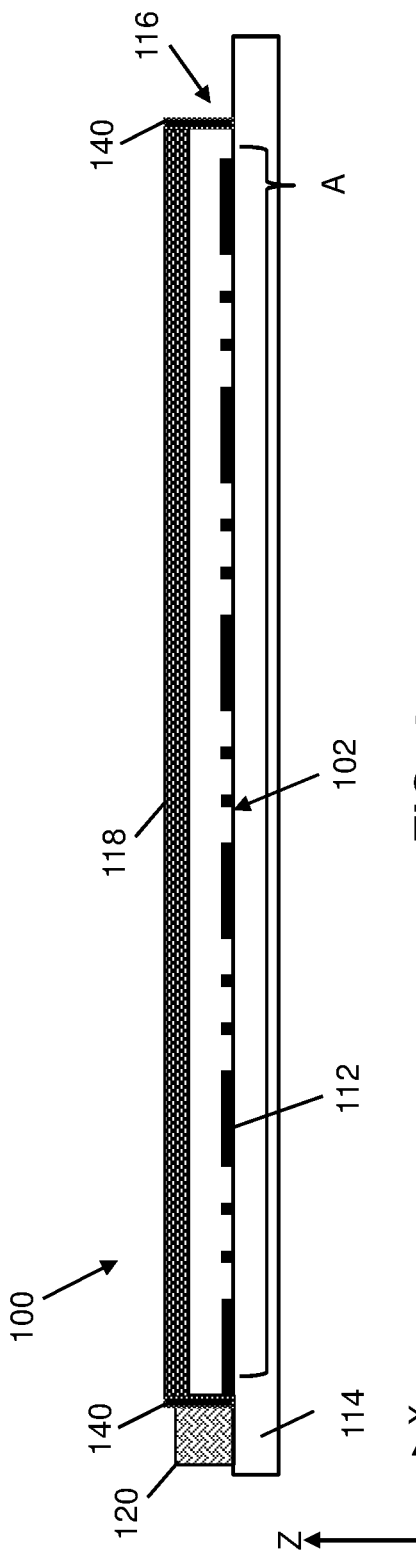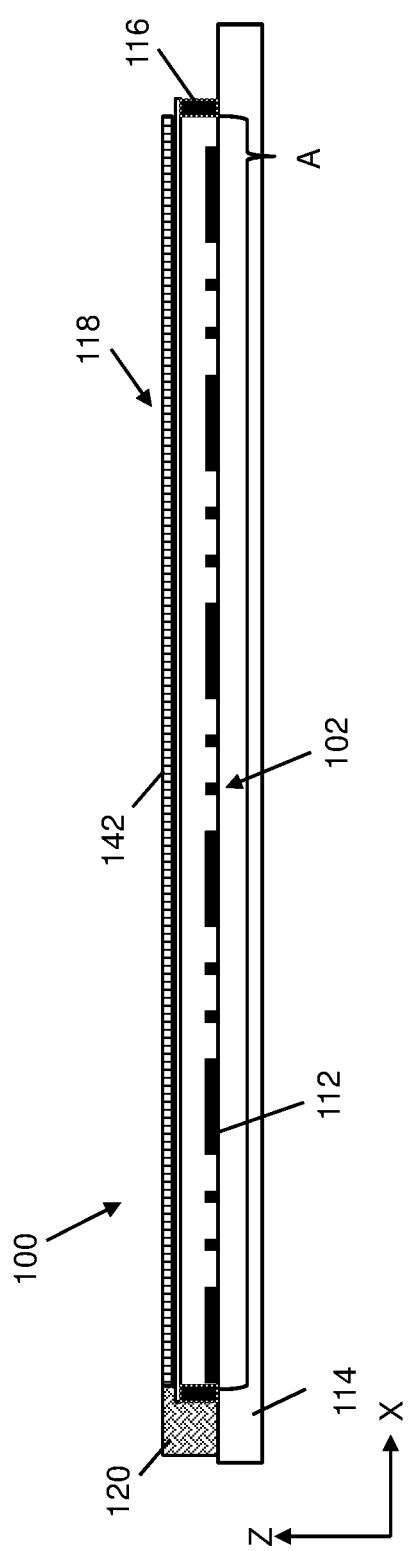

APPARATUS AND RELATED METHOD TO CONTROL RADIATION TRANSMISSION THROUGH MASK PATTERN

TECHNICAL FIELD

Embodiments of the disclosure relate generally to an apparatus and related method to control radiation transmission through a photomask to be used as part of a lithographic transfer process.

BACKGROUND

Photoresist layers, which are used in photolithography to transfer a design pattern onto a semiconductor wafer, are a fundamental component for defining and varying the structure of an integrated circuit (IC) during manufacture. To form a pattern in photoresist layer, a mask (often called a "photomask," "master mask," etc.) with a fixed shape is created based on a desired photoresist layer. By focusing radiation through the mask, then through reduction optics, a photoresist layer is patterned on a wafer to a much smaller scale than the size of the mask. Photoresist layers also may be specially-tailored to hide the location of circuits and create unique complex chip level signatures, but providing such features conventionally requires building a prohibitive number of masks to create the varying photoresist layers. Building multiple designs and mask sets to create multiple versions of a device is possible, but this is costly and in many cases does not provide robust variation nor end-user security from unit-to-unit.

SUMMARY

A first aspect of the present disclosure provides an apparatus including: a mask pattern formed on a mask substrate; and a plurality of spatial radiation modulators vertically displaced from the mask pattern, and distributed across a two-dimensional area, wherein each of the plurality of spatial radiation modulators is adjustable between a first transparent state and a second transparent state to control whether radiation transmitted through the mask pattern passes through each of the plurality of spatial radiation modulators.

A second aspect of the present disclosure provides an apparatus including: a mask substrate having a surface with a mask pattern formed thereon; a pellicle coupled to the surface of the mask substrate, wherein the pellicle horizontally encloses the mask pattern; a plurality of spatial radiation modulators distributed across a two-dimensional area; and a controller communicatively coupled to the plurality of spatial radiation modulators, wherein the controller adjusts the plurality of spatial radiation modulators between a first transparent state and a second transparent state to control whether radiation transmitted through a portion of the mask pattern passes through each spatial radiation modulator.

A third aspect of the present disclosure provides a method to control radiation transmissibility through a mask pattern, the method including: providing an apparatus including: a pellicle coupled to a mask substrate, wherein the pellicle horizontally encloses a mask pattern formed on the mask substrate; and a plurality of spatial radiation modulators vertically displaced from the mask pattern, and distributed across a two-dimensional area; based on a site design for a photoresist, adjusting each of the plurality of spatial radiation modulators between a first transparent state and a second transparent state to control whether radiation transmitted through the mask pattern passes through each of the plurality of spatial radiation modulators; and transmitting radiation through the mask pattern and at least one of the plurality of spatial radiation modulators to form selected features of the mask pattern within a photoresist material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 4 shows a side view in plane X-Z of an apparatus to control radiation transmission through a mask pattern according to further embodiments of the disclosure.

FIG. 5 shows a side view in of an apparatus to control radiation transmission through a mask pattern according to additional embodiments of the disclosure.

Figure 1:
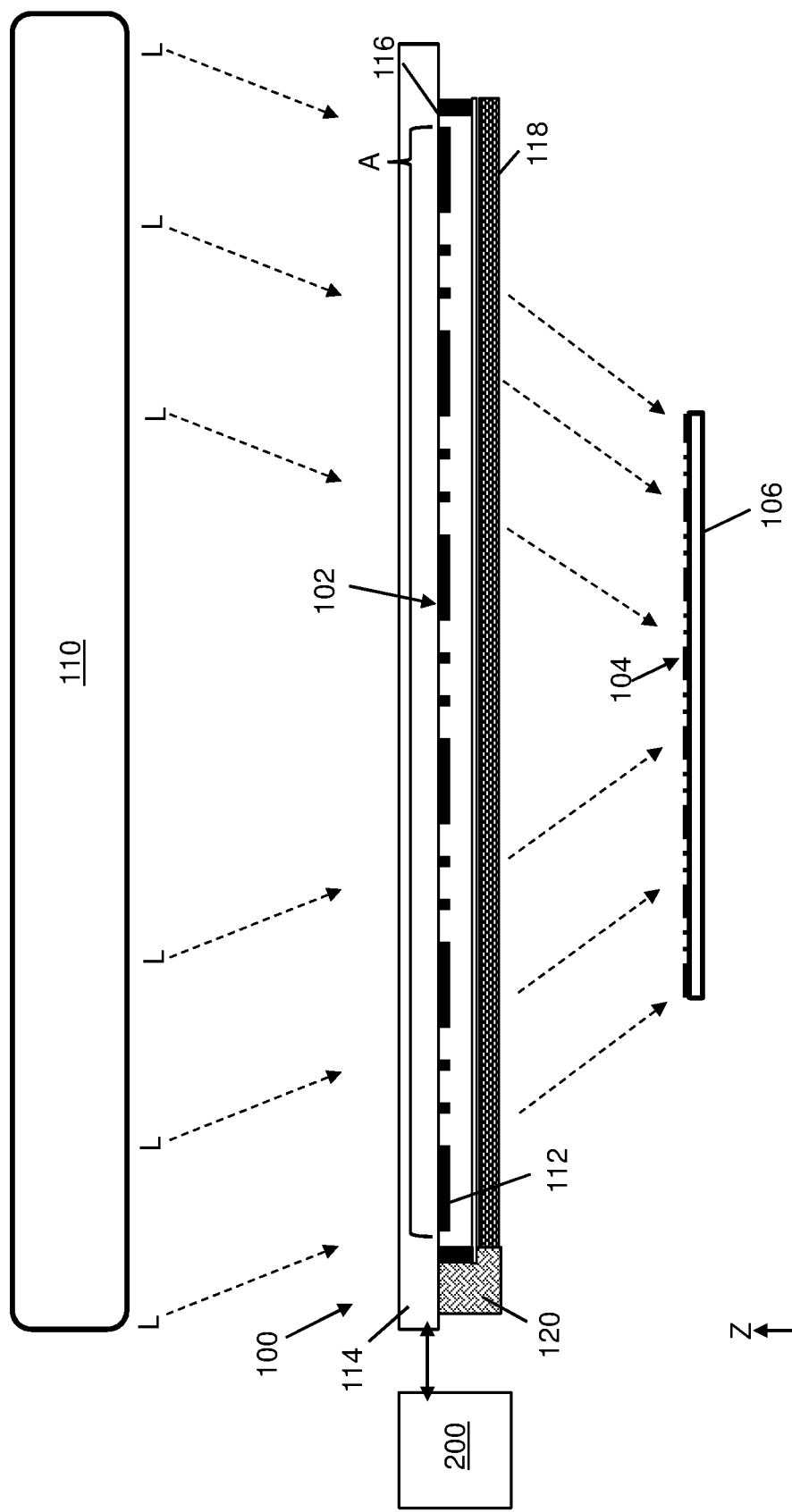
FIG. 1 shows a side view in plane X-Z of an apparatus to control radiation transmission through a mask pattern, in use with a radiation source and photoresist, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an apparatus and related method to form customized photoresists and/or multiple photoresist structures using only relatively few mask patterns, or even a single mask pattern. To provide these technical benefits, an apparatus according to the disclosure may include a plurality of spatial light modulators (SRMs) vertically displaced from portions of a mask pattern. The SRMs may be adjustable between transparent and second transparent states to control whether selected features are formed in a photoresist using the mask pattern. The selected features may be selected to provide varying functionality between units of a product, and/or may be selected solely to identify individual units, designs, tools, etc., for a device.

Embodiments of the disclosure are operable to provide obscuration of one or more features, e.g., wires or vias, by changing the shape of a photoresist from unit to unit. Obscuration generally refers to the use of one or more elements in a wafer to hide the location and/or functionality of other elements in the same wafer. Embodiments of the disclosure are operable to form a photoresist such that one or more additional elements such as wires, vias, etc., will be formed along with desired device components. The additional elements may have limited functionality, cumulative functionality, and/or no functionality in the device. Nevertheless, the presence of such additional elements will obfuscate the operation and/or structure of other circuit elements in the same device. Embodiments of the disclosure are operable to form unique or substantially unique photoresists for each unit of a product, and thus may help to obscure various elements of a product after the product is deployed. The additional elements may also serve other purposes, e.g., identification of tools, fabrication sites, and/or settings used to produce a particular unit. Embodiments of the disclosure thus allow a small number of mask patterns to fabricate a wide variety of tools for functional customization and/or quality of control of products.

Referring to FIG. 1, a side view in plane X-Z of an apparatus 100 is shown according to embodiments of the disclosure. Apparatus 100 is operable to control radiation transmission through a mask pattern 102 to produce a photoresist layer 104 (simply "photoresist" hereafter) on a wafer 106 to manufacture an integrated circuit (IC). Mask 102 may take the form of, e.g., any currently known or later developed mask technology used in photolithography to prevent the exposure of a photoresist to light energy, e.g., ultraviolet (UV) radiation, in selected areas. A radiation source 110, i.e., one or more lamps, diodes, and/or any currently known or later developed instrument capable of producing light within the UV spectrum band or other desired wavelength, may provide the radiation for processing of photoresist 104. The path of radiation from radiation source 110 is indicated in FIG. 1 with arrows L. Mask pattern 102 may be positioned between photoresist 104 and radiation source 110, such that radiation from radiation source 110 must pass through mask pattern 102 before reaching photoresist 104. Mask pattern 102 may include regions of masking material 112, also known as a "radiation absorber," composed of opaque or substantially non-transparent materials (e.g., chrome) mounted on a UV-transparent substrate 114 (simply "mask substrate" hereafter), e.g., quartz and/or glass plating. In a more specific example, masking material 112 and mask substrate 114 of mask pattern 102 may take the form of a chrome-on-glass mask assembly. Locations of mask pattern 102 where masking material 112 does not appear, sometimes known as "blanks" are locations where radiation passes from radiation source 110 to photoresist 104 unimpeded. Incident radiation from radiation source 110 which reaches photoresist 104 will render targeted portions of photoresist 104 more prone or less prone to subsequent processes, e.g., etching. In this manner, photoresist 104 may be patterned to allow subsequent films to be processed to create the structure of components to be formed on a wafer. Photoresist 104 may have a smaller two-dimensional area than mask pattern 102, e.g., due to the demagnification of light after passing through mask pattern 102. This configuration allows the design of the circuit, as represented on mask pattern 102 to be replicated on photoresist 104, but at a different scale.

Conventional masking materials to produce photoresist 104 do not offer the ability to customize the design of the photoresist patterns and subsequent devices formed on wafer 106, without making multiple versions of mask pattern 102 to reflect the different designs. Various embodiments of the disclosure provide an apparatus and method to produce varying photoresists 104 while using only a single unit and design for mask pattern 102. Such apparatuses may be mounted on, and thus positioned above, mask pattern 102 and/or mask substrate 114. According to an example, apparatus 100 may include a pellicle 116 in the form of a frame extending vertically above masking material 112, and horizontally over the two-dimensional area A of masking material 112. Pellicle 116 may be formed of transparent material to prevent defects, e.g., airborne defects or other external contaminants, from contacting mask pattern 102 to affect transmission of light therethrough. Various features for controlling the passage of radiation through mask pattern 102 may be mounted on, or structurally integrated with, pellicle 116 as discussed herein. In some cases, pellicle 116 may be omitted.

Figure 2:
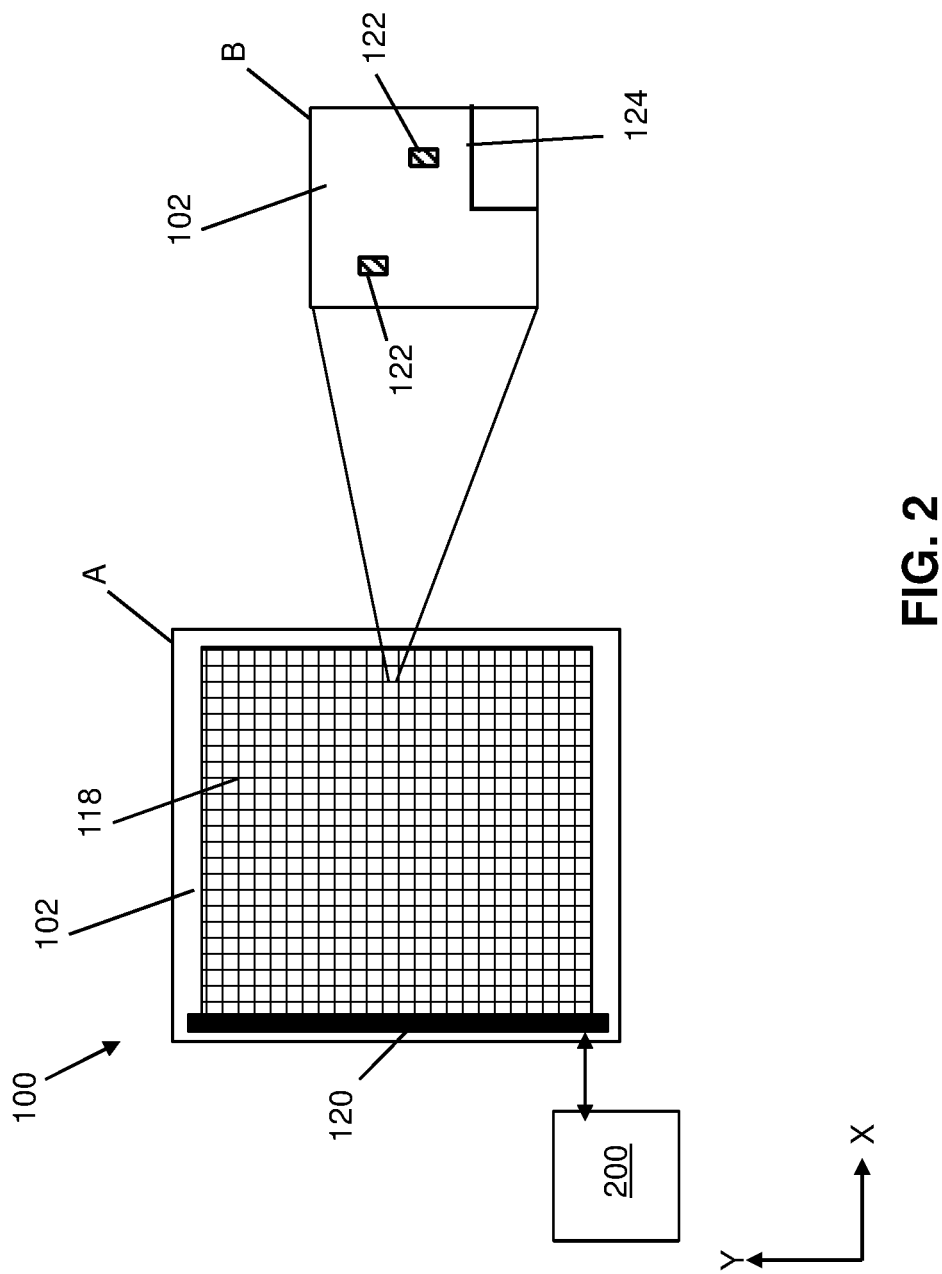
FIG. 2 shows a plan view in plane X-Y of a magnified portion of a mask pattern together with an apparatus according to embodiments of the disclosure.

Referring to FIGS. 1 and 2 together, with FIG. 2 providing a plan view in plane X-Y, a plurality of spatial radiation modulators (simply "SRMs" hereafter) 118 may be coupled to pellicle 116. In cases where pellicle 116 is omitted, SRMs 118 may be vertically displaced from masking material 112 by any other currently known or later developed support structure for supporting SRMs, which may be mounted on or independent of masking material 112. Where applicable, SRMs 118 may be coupled to pellicle 116, e.g., by being mounted on its upper surface or otherwise structurally integrated into one or more surfaces of pellicle 116 above masking material 112. SRMs 118 may include any currently known or later developed object capable of imposing spatially varying modulation on a beam of radiation. SRMs 118 may be controllable by one or more devices electrically coupled thereto, e.g., a control circuit 120 as discussed herein.

Apparatus 100 may also include a controller 200, e.g., one or more computing devices, for governing the operation of apparatus 100. Controller 200 is described in further detail herein relative to FIG. 9. SRMs 118 thus may be adjustable between at least one first transparent state and at least one second transparent state. When in a first transparent state, radiation emitted from radiation source 110 is able to pass through SRM 118 to reach mask pattern 102, where it may pass through to photoresist 104 or may be blocked by masking material 112 in a pattern consistent with the absorber pattern in masking material 112. When in a second transparent state, radiation SRM 118 will prevent radiation emitted by radiation source 110 from passing to mask pattern 102 and/or photoresist 104. It is emphasized that the "first transparent state" does not necessarily require complete transparency, and that the "second transparent state" does not necessarily require complete opacity. The second transparent state may include a state of partial transparency, while providing sufficient opacity to block radiation that would otherwise trigger a chemical reaction in photoresist 104. In any example implementation, the first transparent state may refer to at least eighty percent transparency, while the second transparency state may refer to less than eighty percent transparency.

As shown best in FIG. 2, SRMs 118 may be distributed over two-dimensional area A of mask pattern 102 in plane X-Y. FIG. 1 illustrates SRMs 118 as being vertically displaced from masking material 112. SRMs 118 may include, e.g., an optically-addressed spatial light modulator (OASLM) or simply "light valve," an electrically-addressed spatial light modulator (EASLM), a liquid crystal display (LCD) array or portion thereof, and/or any currently known or later developed instrument for creating adjustable transparency over a desired area. In some cases, the two-dimensional area occupied by SRMs 118 may be less than, equal to, or greater than two dimensional area A of mask pattern(s) 102 thereunder. SRMs 118 individually may cover a subset B of the desired two-dimensional area, and may be arranged in a series of columns and rows or in any other desired configuration. However arranged, a control circuit 120 may be electrically coupled to SRMs 118. Control circuit 120 may be directly electrically coupled to the plurality of SRMs 118, or may be electrically coupled to SRMs 118 through other components, e.g., electrical wires integrated into pellicle 116 or other portions of apparatus 100. Control circuit 120 is thus capable of adjusting one or more SRMs 118 between a transparent and second transparent state to control whether radiation is transmitted therethrough. Control circuit 120 in some cases may include a processor, memory, and other computing element to control which SRMs 118 are transparent or non-transparent, the timing of adjustment between each state, etc. In further embodiments, control circuit 120 may take the form of non-computing hardware capable of implementing commands relayed by one or more controllers and/or other devices external to apparatus 100.

Referring specifically to FIG. 2, SRMs 118 of apparatus 100 may have adjustable transparency to control whether one or more selected design features of mask pattern 102 are transferred to photoresist 104 (FIG. 1). Photoresist 104 may be operable to form any portion of an IC structure, including a device layer, middle-of-line (MOL) layer, back-end-of-line (BEOL) layer, and/or any other conceivable portion of a device. To create differences in the design of individual units, each SRM 118 may be positioned vertically over one or more selected features of mask pattern 102 to control whether the selected features will be transferred to photoresist 104. As examples, FIG. 2 shows an expanded view of a portion of mask pattern 102 with a set of vias 122 and wires 124 that optionally may be formed in photoresist 104. Vias 122 and/or wires 124 may be structured to provide optional functionality of an IC to be manufactured. In further embodiments, vias 122 and/or wires 124 may be created solely for the sake of detecting portions of a device structure, and thus may not serve a functional purpose. Regardless of the purpose of vias 122 and/or wires 124 beneath SRM(s) 118, control circuit 120 may adjust the transparency of SRM(s) 118 to control whether selected via(s) 122 and/or wire(s) 124 are formed within photoresist 124. In this manner, the photoresist(s) 104 produced by mask pattern 102 can vary from unit-to-unit without changing the design of masking material 112 of mask pattern 102.

Figure 3:
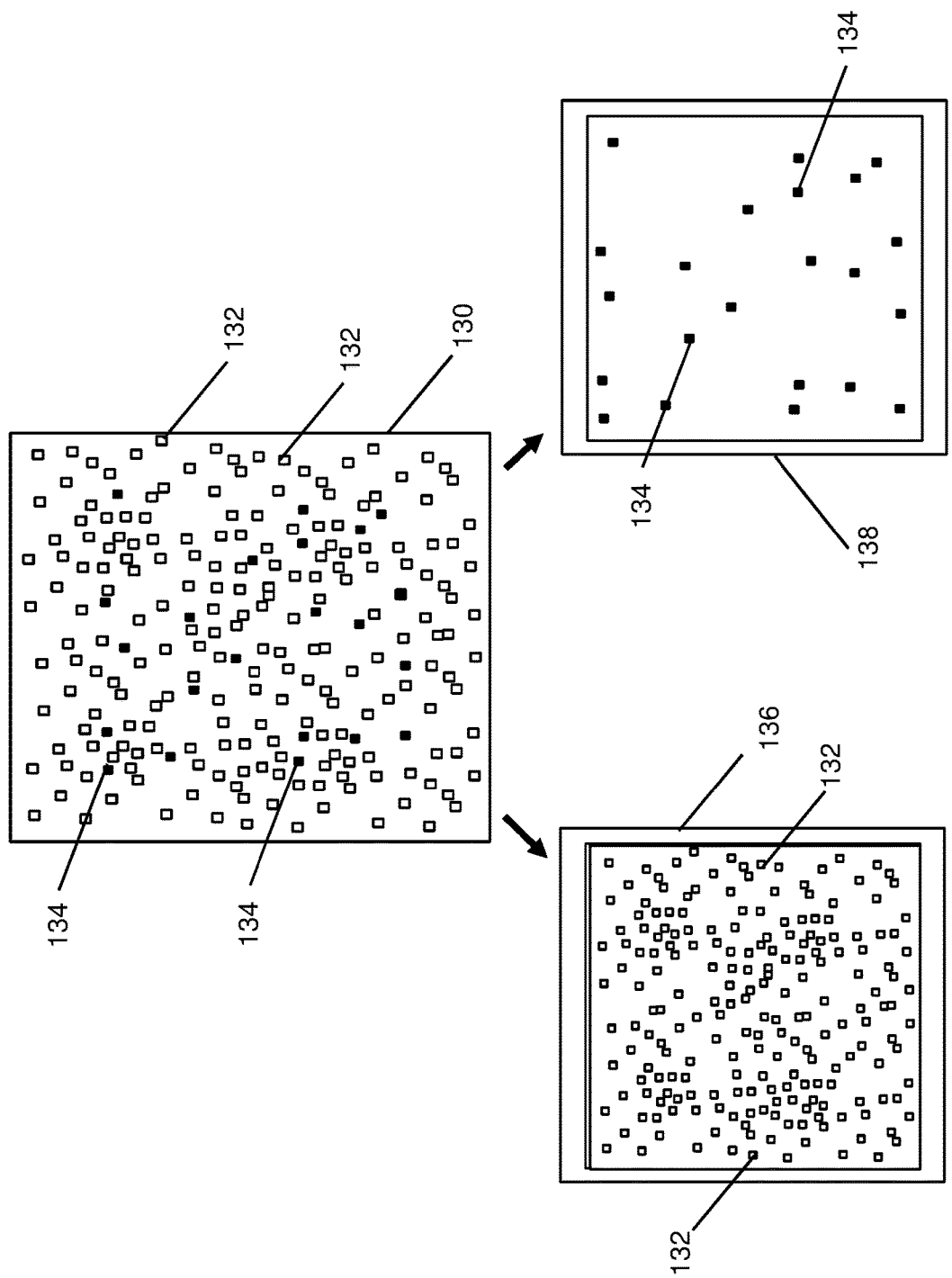
FIG. 3 shows a photoresist site design being subdivided into fixed and variant layers according to embodiments of the disclosure.

Referring to FIG. 3, SRMs 118 may allow photoresists 104 (FIGS. 1, 2) produced by mask pattern 102 (FIG. 1, 2) to deviate from a single design. A site design 130 may represent at least a portion of photoresist 104 to be produced using mask pattern 102. Site design 130 may include, e.g., a set of fixed features 132 (representing, e.g., wire or via shapes) that are desired to appear in every photoresist 104 produced from mask pattern 102. Site design 130 may also include a set of variant features 134 (also representing, e.g., wire or via shapes) that are optional in site design 130 and thus may vary between units of a device. To control whether variant features 134 appear in photoresist 104, site design 130 may be separated into a fixed layer 136 containing only fixed features 132 and a variant layer 138 containing only variant features 134 of photoresist 104. In some cases, fixed layer 136 may represent a first region of site design 130 which includes fixed features 132, while variant layer 138 may represent a second region of site design 130 which includes variant features 134. Fixed layer 132 and variant layer 134 of site design 130 may be recorded as data within controller 200 and/or other devices for governing the operation of apparatus 100 (FIGS. 1, 2), e.g., control circuit 120. In any case, site design 130, fixed layer 132, and/or variant layer 134 may represent instructions to control which SRM(s) 118 are transparent or non-transparent, and the timing of such adjustment as described herein.

Turning now to FIG. 4, further embodiments of apparatus 100 can include SRM(s) 118 at locations other than an upper surface of pellicle 116. In an example embodiment, SRMs 118 may be embedded within pellicle 116 rather than being mounted on an upper surface thereof. In this case, pellicle 116 may include an array of SRMs 118 distributed across two-dimensional area A and mechanically coupled, directly or indirectly, to a vertical frame 140 of pellicle 116. Notwithstanding the structural modifications to pellicle 116, the embodiment of apparatus 100 may function identically to other embodiments, e.g., the embodiment shown in FIG. 1 and discussed elsewhere herein. As shown, SRM(s) 118 may control whether radiation traveling through a selected location will reach mask pattern 102. Additionally, SRM(s) 118 may fluidly isolate underlying portions of mask pattern 102 from contaminants as was possible with other embodiments of pellicle 116. Although the embodiment of apparatus 100 shown in FIG. 4 may provide a more simplified structure than other embodiments, other embodiments of apparatus 100 (e.g., that of FIG. 1) may be preferable for use with existing mask pattern 102 and/or photoresist processing configurations.

Referring to FIG. 5, a further embodiment of apparatus 100 includes SRMs 118 in the form of a liquid crystal display (LCD) array 142 as discussed elsewhere herein. LCD array 142 may constitute a flat-panel display or other electronically modulated optical device that uses the light-modulating properties of liquid crystals. In this case, SRM 118 with LCD array 142 may take the form of a single screen extending over a predetermined area, e.g., area A, and composed of a predetermined number of pixels. Each pixel, in turn, may be cover a predetermined subset of the two-dimensional area, e.g., area A. LCD array 142, similar to other embodiments, may be coupled to control circuit 120 such that control circuit 120 adjusts the transparency of each pixel in LCD array 142. A. Although LCD array 142 is shown by example as being mounted on pellicle 116, it is understood that LCD array 142 optionally may be integrated into the structure of pellicle 116, e.g., as shown in FIG. 4, or may be mounted on other support structures.

Figure 6:
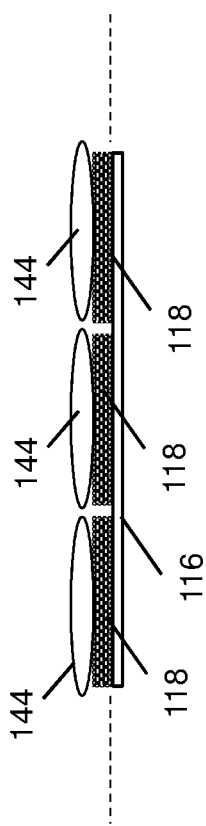
FIG. 6 shows an expanded side view in plane X-Z of an apparatus to control radiation transmission through a mask pattern, with corrective lenses, according to embodiments of the disclosure.
Figure 7:
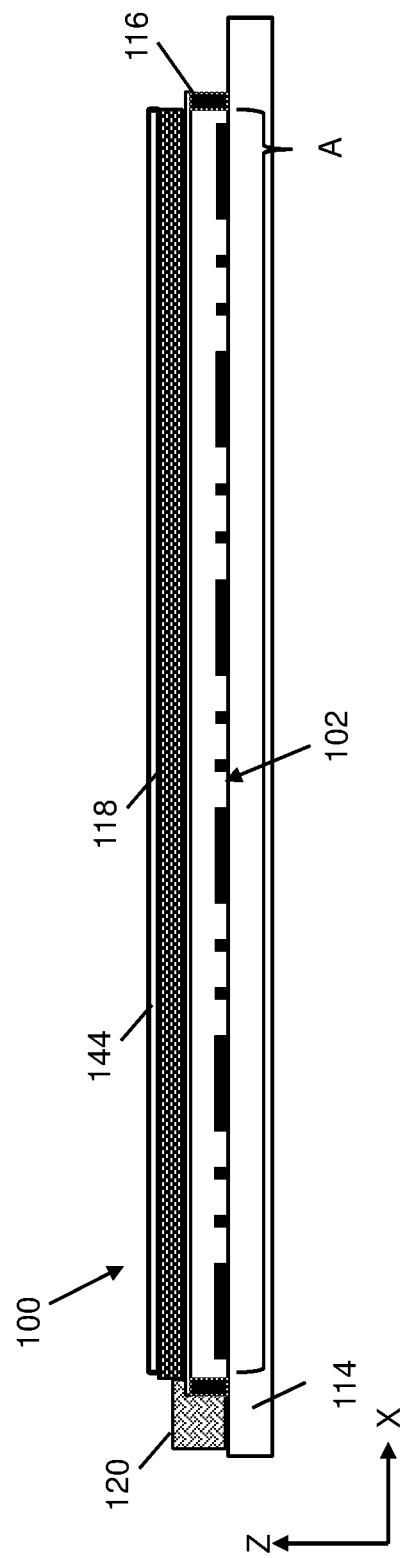
FIG. 7 shows a side view in plane X-Z of an apparatus to control radiation transmission through a mask pattern, with corrective lenses, according to embodiments of the disclosure.

Turning to FIGS. 6 and 7, further embodiments of apparatus 100 can include additional features to compensate for any additional refraction created by SRMs 118. As discussed herein, SRMs 118 may be positioned vertically above mask pattern 102 to control whether radiation at selected locations will pass through mask pattern 102. Since apparatus 100 is capable of being used with conventional mask pattern 102 assemblies, it is possible for SRMs 118 to impose additional refraction on radiation passing therethrough, even when SRMs 118 are in the first transparent state. Such refraction may move the focal plane of the UV radiation in a direction away from the plane of mask pattern 102 itself. According to an example, lenses 144 may be selected to have a different index of refraction where SRMs 118 have a particularly high index of refraction and/or separation distance from mask pattern 102, and vice versa. To compensate for these effects, apparatus 144 may include a plurality of lenses 144 each coupled to a respective one of SRMs 118. FIG. 6 provides a magnified view of lenses 144, while FIG. 7 provides an entire side-view of apparatus 100 with lenses 144 included therein. Lenses 144 may focus radiation toward the plane of mask pattern 102, thereby compensating for any refraction by SRMs 118 thereunder. Lenses 144 may provide this functionality regardless of where SRMs 118 are located and/or how SRMs 118 are embodied. Thus, lenses 144 may be included in apparatus 100 even when SRMs 118 are embedded within pellicle 116, where pellicle 116 is not included, embodied as LCD array 142, etc. As shown specifically in FIG. 7, lenses 144 may be distributed over the entire two-dimensional area of SRMs 118 and/or mask pattern 102, though this is not necessarily required in all instances. In further embodiments, lenses 144 may only be mounted on SRMs 118 at locations with more sensitivity to refraction by SRMs 118.

Figure 8:
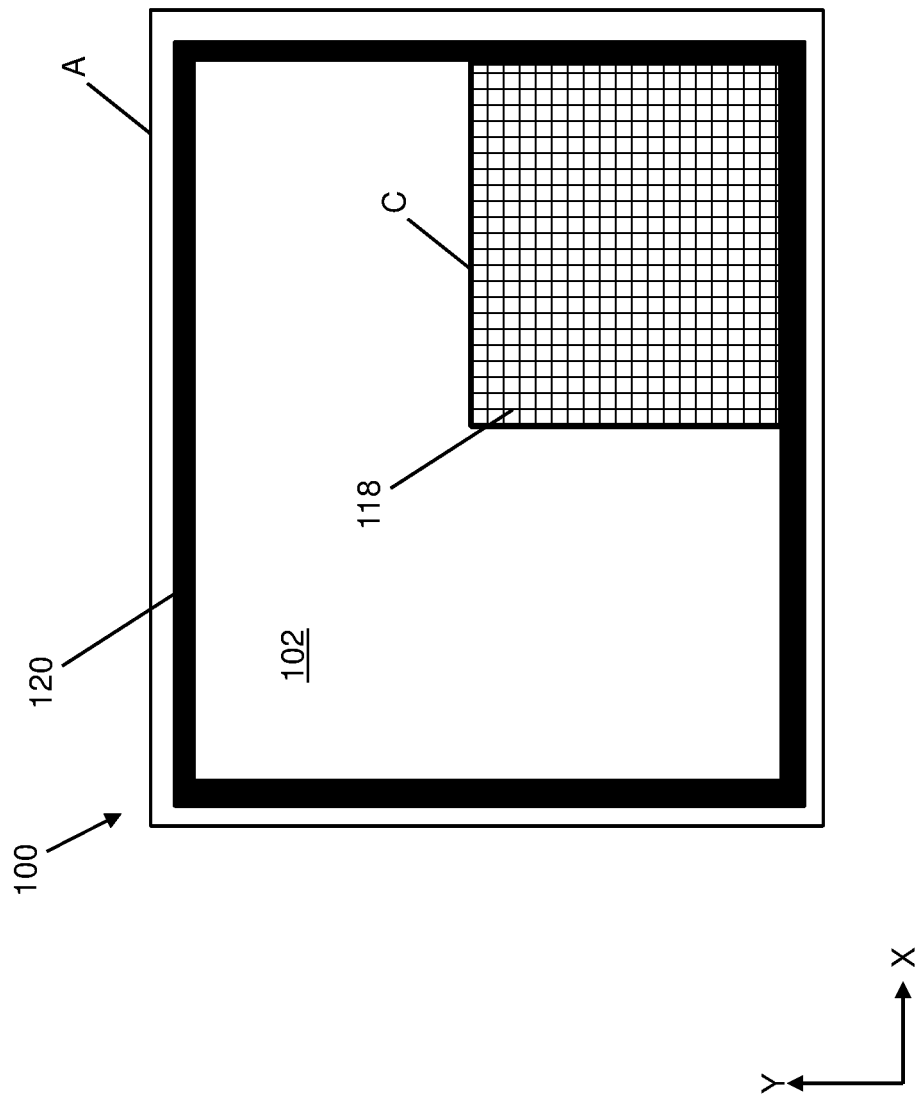
FIG. 8 shows a plan view in plane X-Y of an apparatus with a two-dimensional area less than a mask pattern according to further embodiments of the disclosure.

Referring now to FIG. 8, further embodiments of apparatus 100 may include SRMs 118 distributed over a two-dimensional area that is less than the two-dimensional area of mask pattern 102. SRMs 118 may be distributed over a two-dimensional area C that is less than area A of mask pattern 102 whether embodied as, e.g., optically or electrically addressed SRMs, LCD arrays, etc. According to a more specific example, SRMs 118 may be positioned over a majority or a minority of the entire mask pattern 102 area. According to an example, a user may only desire to form one or more variant features in a subset of the total photoresist 104 (FIG. 1) area. Thus, it may be undesirable to include SRMs 118 across the entire area of mask pattern 102. To accommodate such situations, SRMs 118 may be distributed over area C that is smaller than area A of mask pattern 102. In still further examples, multiple arrays of SRMs 118 may be distributed over multiple smaller regions of area A of mask pattern 102, while not being located over selected portions of mask pattern 102. In such cases, one apparatus 100 may include multiple SRM 118 arrays, which may operate independently of each other and/or may include individual SRMs 118 that operate independently of each other within each array. In any case, control circuit 120 may take the form of an antenna and/or printed circuit board (PCB) surrounding at least a portion of the mask pattern 102 area. In such cases, control circuit 120 may be adapted for coupling to SRM 118 arrays of varying size and/or configured to vary the size or shape of area C within mask pattern 102.

Figure 9:
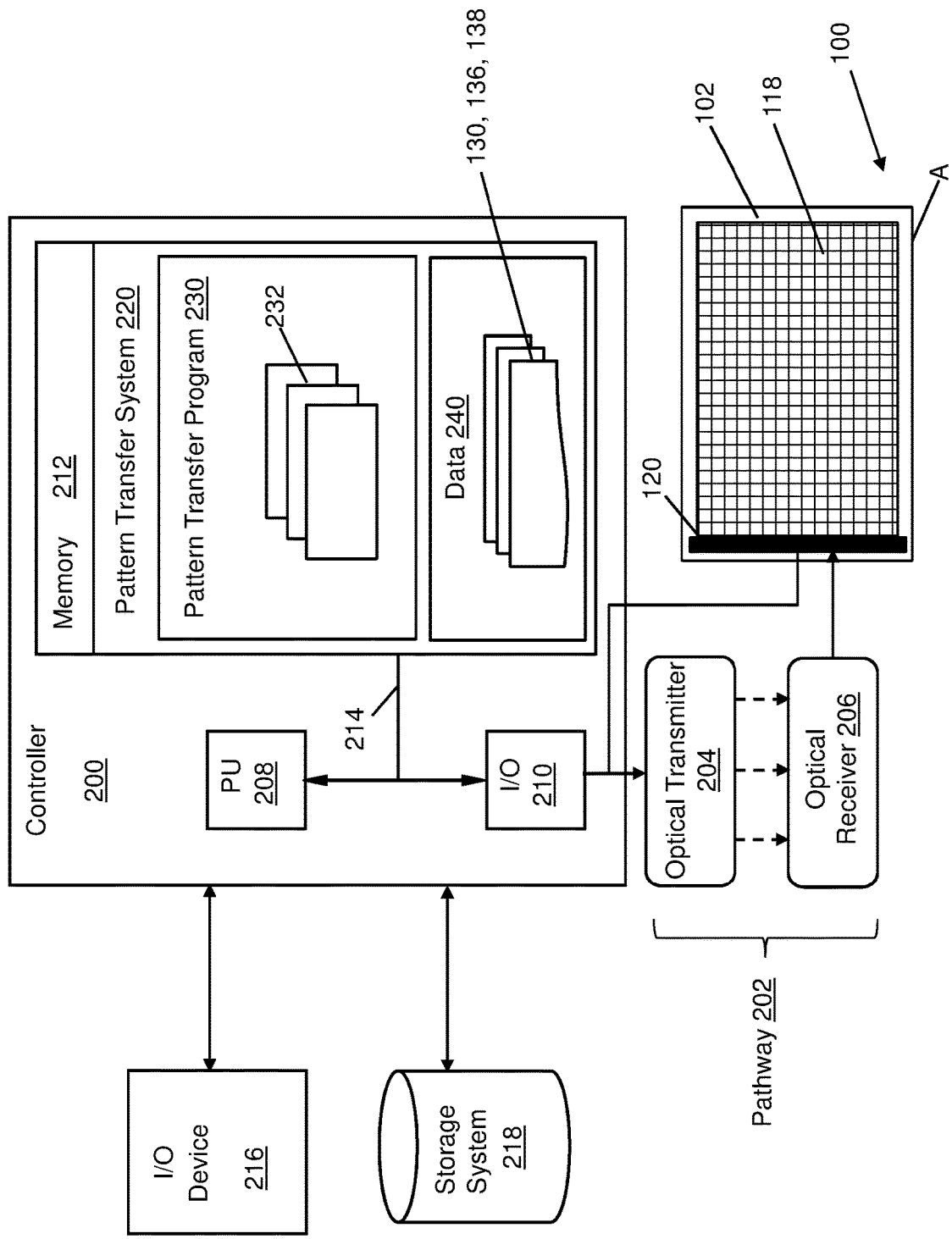
FIG. 9 shows an illustrative environment for providing a controller and apparatus to control radiation transmission through a mask pattern in embodiments of the disclosure.

Turning to FIG. 9, apparatus 100 may include and/or otherwise be coupled to a controller 200 to implement various methods and/or other functions to affect the operation of apparatus 100, including SRMs 118. Controller 200 may be part of control circuit 120 and/or other components described herein, or may be an independent device communicatively coupled to one or more devices within apparatus 100 (e.g., through one or more wired and/or wireless connections). According to another example, controller 200 may be connected to or otherwise part of apparatus 100. Controller 200 is shown connected to SRMs 118 either through control circuit 120, and/or through an optical communications pathway ("pathway") 202 in the example embodiment shown in FIG. 3. Pathway 202 may include, e.g., at least one optical transmitter 204 electrically coupled to controller 200 for transmitting signals to other hardware, and at least one optical receiver 206 may be capable of receiving optical signals from optical transmitter(s) 204 and capable of relaying data from such signals to control circuit 120 and/or other apparatus 100 hardware.

Controller 200 may include a processor unit (PU) 208, an input/output (I/O) interface 210, a memory 212, and a bus 214. Further, controller 200 is shown in communication with an external I/O device 216 and a storage system 218. External I/O device 216 may be embodied as any component for allowing user interaction with controller 200. Controller 200 may include hardware and/or software for implementing methods to transfer the pattern of mask pattern 102 to a respective photoresist 104 (FIG. 1), a process which is hereafter referred to as "pattern transfer." Controller 200 may include a pattern transfer system 220 embedded therein, e.g., by being stored in memory 212. Pattern transfer system 220 can execute a pattern transfer program 230, which in turn can include various modules 232, e.g., one or more software components configured to perform different actions, including without limitation: a calculator, a determinator, a comparator, etc. Modules 232 can implement any currently known or later developed analysis technique for selecting SRMs 118 to adjust between first and second transparent states, and/or selecting a time at which SRMs 118 will be adjusted between such states. Controller 200 in some cases may operate as a part of control circuit 120, while in other cases controller 200 may be an independent component in communication with one or more apparatuses 100 according to embodiments of the disclosure.

Modules 232 of pattern transfer program 230 can use calculations, look up tables, and similar tools stored in memory 212 for processing, analyzing, and operating on data to perform their respective functions. In general, PU 208 can execute computer program code, such as pattern transfer system 220 which can be stored in memory 212 and/or storage system 218. While executing computer program code, PU 208 can read and/or write data to or from memory 212, storage system 218, and/or I/O interface 210. Bus 214 can provide a communications link between each of the components in controller 200. I/O device 216 can comprise any device that enables a user to interact with controller 200 or any device that enables controller 200 to communicate with one or more embodiments of apparatus 100 described herein and/or other computing devices. I/O device 216 (including but not limited to keyboards, displays, pointing devices, etc.) can be coupled to apparatus 100 and/or other controllers 200 directly or through intervening I/O controllers (not shown).

Memory 212 can include a cache of data 240 organized for reference by pattern transfer program 230. As discussed elsewhere herein, controller 200 can send, receive, and/or rely various types of data 240. Data 240 may include, e.g., one or more site designs 130, fixed layers 136, and/or variant layers 138 for photoresists 104 (FIG. 1) to be manufactured. Data 240 thus may be classified into multiple fields and, where desired, sub-fields within each field of data 240. Where site designs 130 for one or more photoresists 104 are separated into fixed layers 136 and/or variant layers 138, data 240 optionally may include separate fields for each layer 136, 138. Data 240 may be provided, e.g., via I/O device 216 and/or storage system 218.

Controller 200, and/or components of apparatus 100 which include controller 200 therein, may comprise any general purpose computing article of manufacture for executing computer program code installed by a user (e.g., a personal computer, server, handheld device, etc.). However, it is understood that controller 200 is only representative of various possible equivalent computing devices that may perform the various process steps of the disclosure. To this extent, in other embodiments, controller 200 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively. In one embodiment, controller 200 may include a program product stored on a computer readable storage device, which can be operative to operate SRMs 118 to control radiation transmission through mask pattern 102.

Figure 10:
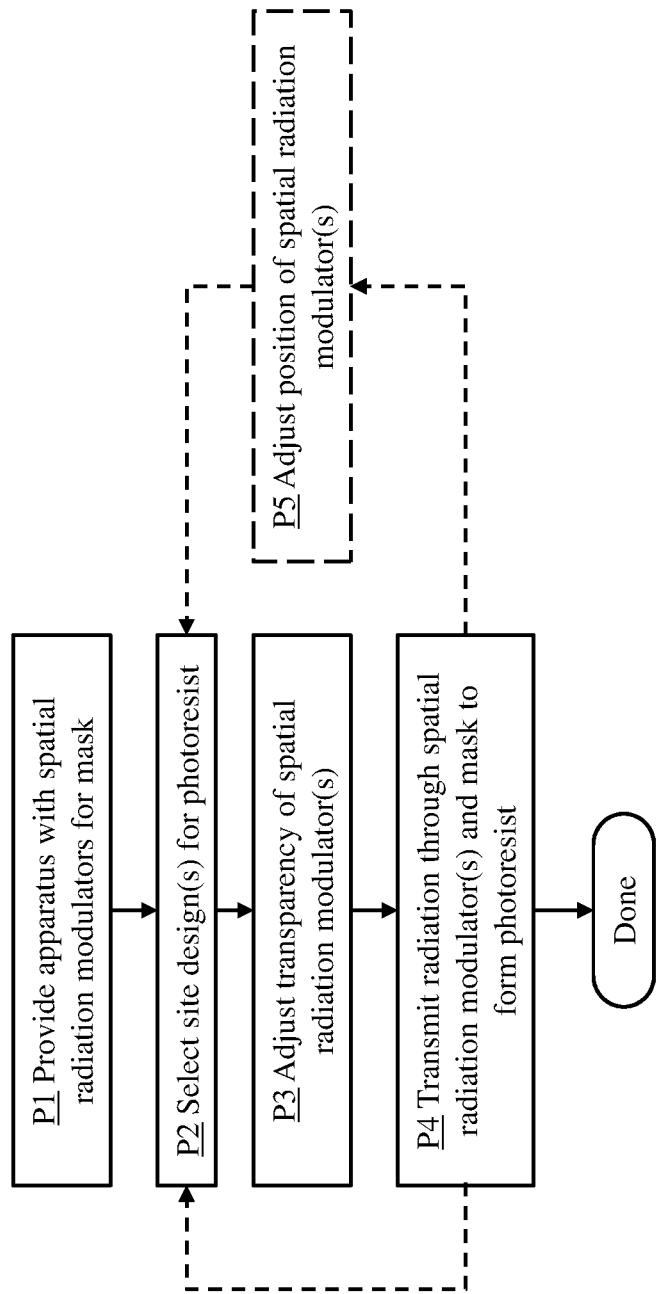
FIG. 10 provides an illustrative flow diagram for implementing methods to control radiation transmission through a mask pattern in embodiments of the disclosure.

Referring now to FIG. 10, with continued reference to FIGS. 1 and 9, embodiments of the disclosure provide a method for controlling radiation transmission through mask pattern 102 to produce varying photoresists 104. A generalized method according to the disclosure may include, e.g., using SRMs 118 to control whether radiation from radiation source 110 will reach mask pattern 102 at selected locations, thereby affecting whether one or more features within mask pattern 102 are formed in photoresist layer 104. These processes may include various sub-processes and additional steps, and an example method according to the disclosure is discussed herein.

At process P1, embodiments of the disclosure can include providing an apparatus (e.g., an embodiment of apparatus 100) with SRMs 118 positioned over mask pattern 102. In some cases, the providing in process P2 may include positioning SRMs 118 above mask pattern 102 such that SRMs 118 will control whether radiation reaches mask pattern 102 at selected locations. In further embodiments, process P1 may include mounting SRMs 118 and/or other portions of apparatus 100 on mask pattern 102 and/or various components connected thereto. In any case, SRMs 118 may be operable to affect whether radiation from radiation source 110 reaches mask pattern 102 at selected locations after process P1 concludes.

Continuing to process P2, methods according to the disclosure may include selecting one or more site designs (e.g., site design 130 (FIG. 3) and/or layers 136, 138 (FIG. 3) thereof) indicative of photoresist(s) 104 to be manufactured. Process P2 may be implemented independently of process P1 in cases where controller 200 selects site designs for manufacture. In other embodiments, process P2 may be implemented directly in apparatus 100 via control circuit 120. The selecting of site designs in process P2 may determine whether one or more variant features (including, e.g., features for additional functionality and/or detection of a unit) will appear in photoresist 104.

Continuing to process P3, embodiments of the disclosure include adjusting the transparency of SRMs 118, e.g., by adjusting each SRM 118 between a non-transparent or first transparent state, based on where desired features will be formed in photoresist 104. According to one example, a user may not wish to include features with particular functionality in photoresist 104. To provide this outcome, SRM(s) 118 above the relevant feature(s) may become non-transparent to prevent radiation from radiation source 110 from reaching mask pattern 102 at selected locations, and thereby prevent transfer of these features to photoresist 104. Conversely, where a user desires to include one or more variant features in photoresist 104, process P3 may include causing selected SRM(s) 118 above the relevant feature(s) to become transparent to allow passage of radiation through SRM(s) 118 to mask pattern 102 at selected locations. In yet another example, to provide features for detecting the product unit that is being manufactured, process P3 may include changing which SRM(s) 118 are transparent and non-transparent to form a unique set of variant features within photoresist 104. Regardless of the basis for adjusting whether SRM(s) 118 will be transparent or non-transparent, the method may proceed to process P4 of transmitting radiation through mask pattern 102 and/or spatial radiation modulator(s) 118 to form photoresist 104. In some cases, the method may conclude ("Done") after process P4 is implemented.

According to further embodiments, the method may continue to other processes after process P4 concludes. In one example, the method may return to process P2 of selecting one or more additional site designs for the manufacture of photoresist 104. For example, the first instance of process P2-P4 may use a site design which includes only fixed features 132 (FIG. 3) of photoresist 104 to be formed (e.g., based on fixed layer 136 (FIG. 3)). A manufacturer subsequently may form one or more variant features in the same unit of photoresist 104. To provide this function, process P2 may be implemented to select one or more other site designs for photoresist 104 with variant features 134 (FIG. 3) to be formed in photoresist 104 (e.g., based on variant layer 138 (FIG. 3)). Thereafter, apparatus 100 can change the transparency of selected SRM(s) 118 (e.g., via control circuit 120 and/or controller 200) to allow one or more variant features 134 to be formed in photoresist 104. Process P4 can then be re-implemented to form variant feature(s) 134 in photoresist 104.

According to still further embodiments, methods of the disclosure may include further steps to modify the features produced in photoresist 104. According to one example, methods of the disclosure may include an additional process P5 of changing the position of SRM(s) 118 above mask pattern 102, and optionally changing the position of radiation source 110 based on the position of SRM(s) 118. Process P5 may be implemented, e.g., in embodiments where SRM(s) 118 are distributed over a two-dimensional area that is less than that of mask pattern 102. Changing the position of SRM(s) 118 may be implemented manually, automatically or semi-automatically via controller 200 with the aid of robotic adjustment devices, and/or by any currently known or later developed process to move SRM(s) 118 into various positions. After process P5 is implemented, processes P2-P4 may be re-implemented to select one or more additional site design(s) 130, 136, 138 to form new features within other locations of photoresist 104. Regardless of whether processes P2-P4 are repeated and/or whether process P5 is implemented, the method may conclude after desired features are formed in photoresist 104 using mask pattern 102 and SRM(s) 118.

Embodiments of the disclosure are operable to provide several technical commercial and technical advantages, some of which are described by example herein. Embodiments of the disclosure allow a fabricator to use only one mask pattern, or otherwise a limited number of mask patterns, to form photoresists with highly customizable features therein. The selected features may be selected to provide varying functionality between units of a product, and/or may be selected solely to identify individual units, designs, tools, etc., for a device. According to a specific example, the variant features may be selected to identify which tool, fabrication site, and/or manufacturing settings were chosen to produce other non-varying features of a photoresist. In this manner, a single mask pattern can be fabricated to include a wide-variety of tools for functional customization and/or quality of control of products.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a mask pattern formed on a mask substrate, and having a two-dimensional area; and
    a plurality of spatial radiation modulators vertically displaced from the mask pattern, and distributed across a two-dimensional area that is less than the two-dimensional area of the mask pattern,
    wherein each of the plurality of spatial radiation modulators is adjustable between a first transparent state and a second transparent state to control whether radiation transmitted through the mask pattern passes through each of the plurality of spatial radiation modulators.

2. The apparatus of claim 1, wherein the plurality of spatial radiation modulators are mounted on a pellicle coupled to the mask substrate, or included within the pellicle.

3. The apparatus of claim 1, further comprising a plurality of lenses each coupled to a respective one of the plurality of spatial radiation modulators, wherein the plurality of lenses focuses radiation based on a vertical separation between the mask pattern and the plurality of spatial radiation modulators.

4. The apparatus of claim 1, wherein the plurality of spatial radiation modulators comprises a liquid crystal display (LCD) array.

5. The apparatus of claim 1, wherein the mask substrate comprises glass, and wherein the mask pattern comprises chromium.

6. The apparatus of claim 1, further comprising a controller communicatively coupled to the plurality of spatial radiation modulators, wherein the controller adjusts the plurality of spatial radiation modulators between the first transparent state and the second transparent state.

7. The apparatus of claim 6, wherein the controller adjusts the plurality of spatial radiation modulators between the first transparent state and the second transparent state based on a selected one of a plurality of mask designs.

8. The apparatus of claim 6, wherein the controller is wirelessly coupled to a control circuit electrically coupled to the plurality of spatial radiation modulators, and wherein a voltage output of the control circuit adjusts the plurality of spatial radiation modulators between the first transparent state and the second transparent state based on data received from the controller.

9. The apparatus of claim 8, wherein the controller is wirelessly coupled to the control circuit via an optical communication pathway.

10. An apparatus comprising:
a mask substrate having a two dimensional area, and a surface with a mask pattern formed thereon;
a pellicle coupled to the surface of the mask substrate, wherein the pellicle horizontally encloses the mask pattern;
a plurality of spatial radiation modulators vertically displaced from the surface of the mask substrate and the mask pattern, and distributed across a two-dimensional area that is less than the two-dimensional area of the mask pattern; and
a controller communicatively coupled to the plurality of spatial radiation modulators, wherein the controller adjusts the plurality of spatial radiation modulators between a first transparent state and a second transparent state to control whether radiation transmitted through a portion of the mask pattern passes through each spatial radiation modulator.

11. The apparatus of claim 10, further comprising a plurality of lenses each coupled to a respective one of the plurality of spatial radiation modulators, wherein the plurality of lenses focuses radiation based on a vertical separation between the mask pattern and the plurality of spatial radiation modulators.

12. The apparatus of claim 10, wherein the controller adjusts the plurality of spatial radiation modulators between the first transparent state and the second transparent state based on a selected one of a plurality of mask designs.

13. The apparatus of claim 10, wherein the controller is wirelessly coupled to a control circuit mounted on the pellicle and electrically coupled to the plurality of spatial radiation modulators, and wherein a voltage output of the control circuit adjusts the plurality of spatial radiation modulators between the first transparent state and the second transparent state based on data received from the controller.

14. The apparatus of claim 13, wherein the mask pattern includes a first region having a set of fixed features and a second region having a set of variant features, and wherein the plurality of spatial light modulators is vertically displaced from at least the second region of the mask pattern.

15. A method to control radiation transmissibility through a mask pattern, the method comprising:
providing an apparatus including:
a pellicle coupled to a mask substrate, wherein the pellicle horizontally encloses a mask pattern formed on the mask substrate, the mask pattern having a two-dimensional area; and
a plurality of spatial radiation modulators vertically displaced from the mask pattern, and distributed across a two-dimensional area;
based on a site design for a photoresist, adjusting each of the plurality of spatial radiation modulators between a first transparent state and a second transparent state to control whether radiation transmitted through the mask pattern passes through each of the plurality of spatial radiation modulators;
adjusting a position of the plurality of spatial radiation modulators within the two-dimensional area, wherein a two-dimensional area of the plurality of spatial radiation modulators is less than the two-dimensional area of the mask pattern; and
transmitting radiation through the mask pattern and at least one of the plurality of spatial radiation modulators to form selected features of the mask pattern within a photoresist material.

16. The method of claim 15, further comprising, based on the site design for the photoresist, repeating the adjusting and the transmitting to form at least one variant feature in the photoresist material, based on the site design.

17. The method of claim 16, further comprising:
forming a first photoresist layer from the photoresist material using the mask pattern and the plurality of spatial radiation modulators, wherein the first photoresist layer includes the at least one variant feature; and
forming a second photoresist layer from the photoresist material using the mask pattern and the plurality of spatial radiation modulators, wherein the second photoresist layer does not include the at least one variant feature.

18. The method of claim 15, wherein the site design for the photoresist includes a first region having a set of fixed features and a second region having a set of variant features, wherein adjusting the plurality of spatial radiation modulators includes adjusting at least one spatial radiation modulator vertically displaced from the second region.

* * * * *